United States Patent
Akashi et al.

(10) Patent No.: US 7,313,331 B2
(45) Date of Patent: Dec. 25, 2007

(54) OPTICAL COMMUNICATION DEVICE, OPTICAL TRANSMITTER, OPTICAL TRANSMITTER-RECEIVER, AND OPTICAL TRANSMISSION SYSTEM

(75) Inventors: Mitsuo Akashi, Chigasaki (JP); Hironori Saitoh, Yokohama (JP); Fumitoshi Goto, Yokohama (JP); Raju Kankipati, Yokohama (JP); Hirofumi Nakagawa, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 666 days.

(21) Appl. No.: 10/238,207

(22) Filed: Sep. 9, 2002

(65) Prior Publication Data
US 2004/0208633 A1 Oct. 21, 2004

(30) Foreign Application Priority Data
Jul. 30, 2002 (JP) .............................. 2002-221082

(51) Int. Cl.
*H04B 10/00* (2006.01)
*H05K 7/00* (2006.01)

(52) U.S. Cl. ....................................... 398/135; 361/728

(58) Field of Classification Search ................ 398/135, 398/138, 139, 140, 141, 164; 257/79, 80, 257/81, 82, 83, 84, 99; 385/88, 89, 90, 91, 385/92, 93, 94
See application file for complete search history.

(56) References Cited

U.S. PATENT DOCUMENTS 5,528,408 A * 6/1996 McGinley et al. .......... 398/139
5,555,477 A * 9/1996 Tomooka et al. ........... 398/164
6,164,838 A * 12/2000 Maehara et al. ............... 385/92
6,445,475 B1 * 9/2002 Okubora et al. ............ 398/141
6,952,532 B2 * 10/2005 Dair et al. .................. 398/139

FOREIGN PATENT DOCUMENTS

| JP | 58-83192 A | 6/1983 |
| JP | 08-037500 A | 2/1996 |
| JP | 11-163566 A | 6/1999 |
| JP | 11-177278 A | 7/1999 |
| JP | 2001-085780 A | 3/2001 |
| JP | 2001-210976 A | 8/2001 |

* cited by examiner

*Primary Examiner*—Shi K Li
(74) *Attorney, Agent, or Firm*—Townsend and Townsend and Crew LLP

(57) ABSTRACT

The printed circuit board with the respective components of the optical transmitter-receiver mounted thereon is split into several parts, the fixing position of which respective parts with regard to the housing is set according to the standardized size of the respective components and which respective parts are interconnected through an electric connector and so forth, which makes the height of the transmitter-receiver lower. The split circuit boards are overlapped such that they make no contact with one another so as to enlarge the area of the circuit boards or practically increase the packaging area of the respective components, which realizes the structural compactness of the optical transmitter-receiver. The packaging side of the respective components is selected in an arbitrary manner according to the cooling direction of the respective ICs, which allows such direction to be oriented to the side of the heat sinks so as to enhance cooling behavior. When deteriorated parts are found, only the circuit board with such parts mounted is removed for repair or replacement, resulting in improving productivity and reducing production cost.

7 Claims, 7 Drawing Sheets

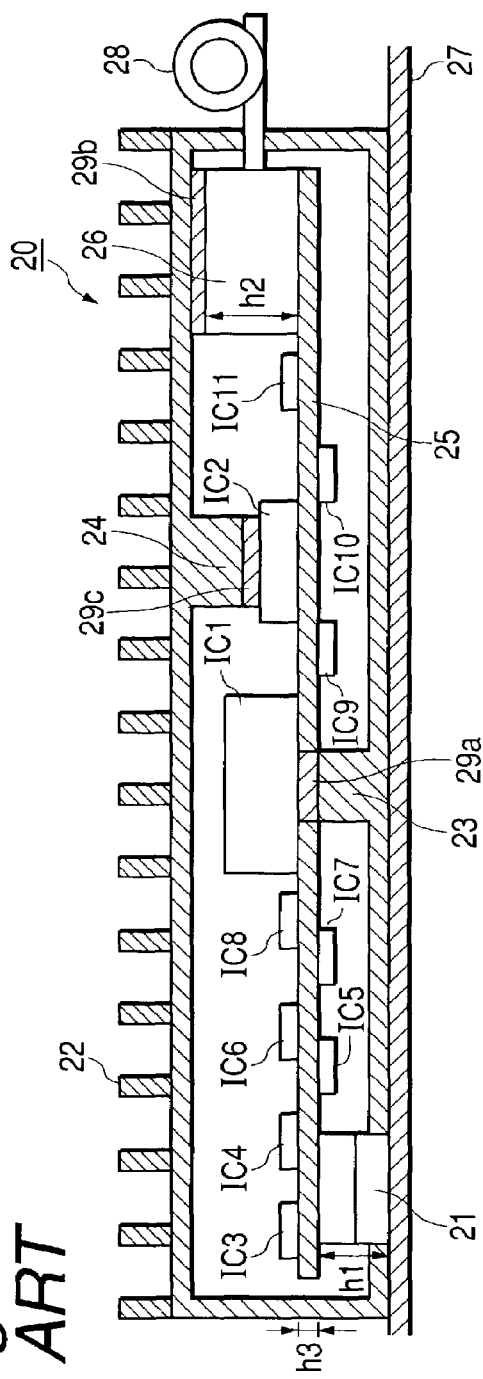
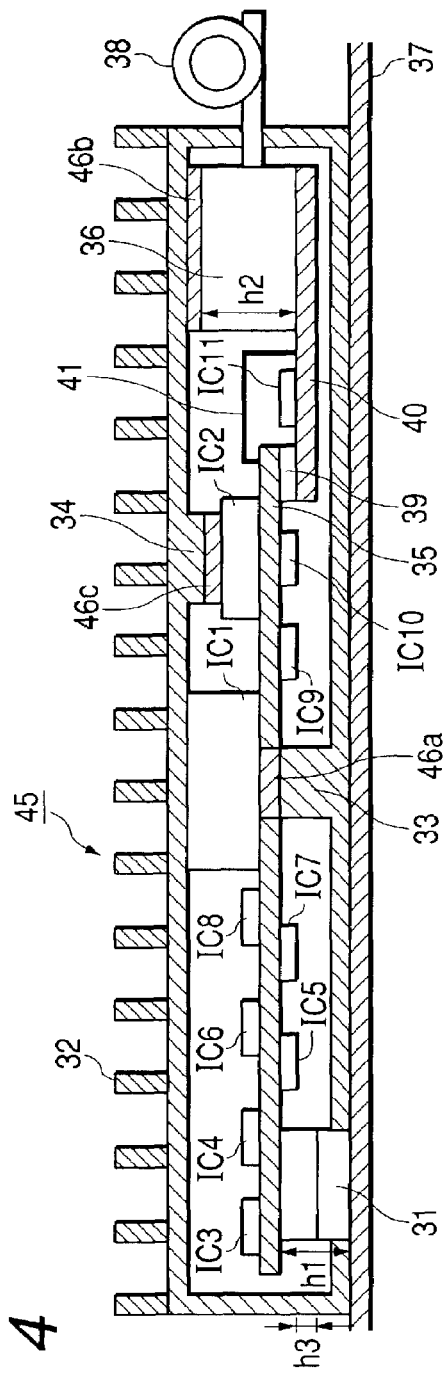
FIG. 3 PRIOR ART
FIG. 4

OPTICAL COMMUNICATION DEVICE, OPTICAL TRANSMITTER, OPTICAL TRANSMITTER-RECEIVER, AND OPTICAL TRANSMISSION SYSTEM

FIELD OF THE INVENTION

The present invention relates to an optical communication device such as an optical transmitter and/or an optical receiver to be used for an optical communication system and an optical transmission system, in more details, pertaining to an optical transmitter-receiver technology to realize the compactness of the components thereof and a lower production cost thereof by implementing compactness, reduction in height, expanding the operating temperature range thereof as well as improving productivity thereof.

PRIOR ART

The optical transmitter of the optical fiber communication converts an input electrical signal into an optical signal so as to feed the latter to an optical fiber. The optical receiver receives the optical signal transmitted through the optical fiber so as to reproduce the initial electrical signal. The handling of a higher speed signal exceeding a GHz-scaled frequency complicates the processing of the electrical signal on the printed circuit board. Therefore, wiring is arranged on the printed circuit board by use of lower speed parallel signals. The higher speed signals are processed on the optical transmitter and optical receiver on which a light emitting device, a light receiving device and a demultiplexing circuit and so forth are mounted, to integrate the sections thereof handling the higher speed signals so as to restrain waveform attenuation and distortion.

The standardization of the specifications and function of the optical transmitter-receiver is going on wherein the outer dimension of the housing, the disposition of the electrical connector and pin as well as the operating environment and the characteristics of the optical and electrical signal sections thereof are commonly standardized. It is essential that the respective vendors should supply an optical transmitter-receiver in compliance with such standardization. Generally, the optical transmitter comprises a light emitting device module, a light emitting device driving circuit, a clock multiple circuit and a data multiplexing circuit. The light emitting device module incorporates a temperature control circuit for the same device. The optical receiver comprises a light receiving device module, an amplification circuit, a clock extraction circuit, a discrimination circuit and an isolation circuit. Those circuits are integrated into the respective ICs, which ICs are respectively mounted on the separate packages. Those components are normally mounted on a piece of printed circuit board wherein such components as requiring cooling operation are either directly fixed on a heat sink of the housing or brought into contact via a heat conductor such as elastomer with a cooling post extending from the housing so as to enhance cooling behavior.

FIG. 3 is a partly sectional side view of the prior optical transmitter-receiver. As shown in the figure, the housing 20 is held by a mother board 27 and houses cooling heat sinks 22. An optical device module 26 and IC1 to IC10 are mounted on a printed circuit board 25. Reference numeral 21 indicates an electric connector, one side of which connector is held to the mother board 27 while the other side of which being held to the printed circuit board 25. Among the semiconductor integrated circuits (hereinafter, referred to as IC), IC1 is mounted on the upper surface of the printed circuit board 25 due to its height, the cooling body of which IC is found at the bottom side thereof so that a cooling post 23 provided in the housing 20 is brought into via a cooling rubber sheet 29a with the IC1 by providing an aperture through the printed circuit board 25. The optical device module 26 is the highest electronic component of all and is mounted on the upper surface of the printed circuit board 25, the upper surface of which module is brought into contact via a cooling rubber sheet 29b with the backside of the housing 20 in which heat sinks 22 are provided. An IC2 is cooled by making a post 24 extending from the backside surface of the housing 20 contact thereto via a cooling rubber sheet 29c. In the printed circuit board 25, there are mounted IC3 to IC11 besides the IC1 and IC2. Reference numeral 28 indicates an optical fiber.

The streamlined structure of the optical transmitter-receiver with the cooling characteristics of high efficiency is disclosed in Japanese Patent Laid-open No. 11-345987.

SUMMARY OF THE INVENTION

In the packaging method of the prior optical transmitter-receiver, as shown in FIG. 3, the components thereof are mounted to one sheet of printed circuit board 25 wherein such components as requiring cooling operation are either directly connected to the heat sinks 22 of the housing 20, or brought into contact via heat conductors 29a to 29c such as elastomer with the cooling posts 23 and 24 extending from the housing 20 so as to enhance cooling behavior.

In the above prior packaging method, one sheet of printed circuit board is adopted so that the dimension of the board depends on the size and quantity of the respective components, which makes it hard to meet the standardized requirements especially in the case of a high-density packaging process.

Further, in the prior optical transmitter-receiver in compliance with the required specifications, a connector 21 to connect an optical transmitter-receiver to a mother board, to which the transmitter-receiver is mounted, is standardized, which results in standardizing the height h1 of the connector 21 as well as the interval between the printed circuit board 25 with one side of the connector 21 mounted, which side interfaces with the optical transmitter-receiver, and the mother board 27. Given that the highest component of all is an optical device module 26 with the height of h2 and the h2 is larger than the h1, the module 26 is incapable of being mounted to the lower surface of the printed circuit board 25, which results in the module being mounted to the upper surface thereof. In this case, given that the thickness of the printed circuit board 25 is defined as h3 and disregarding the height of the heat conductor 29b, the height of the housing 20 amounts to h1+h2+h3. Such large height of the housing 20 makes it hard to meet the required specifications of the optical transmitter-receiver. The height of the respective components controls the packaging side of the printed circuit board 25 so as to be face with the difficulty to meet the height standardized for the transmitter-receiver.

As for the cooling aspect of the components, the higher the housing 20 becomes, the longer the cooling post 24 extending from the heat sink 22 becomes so as to deteriorate cooling behavior. Another issue related with the packaging side of the circuit board that is controlled by the height of the respective components is concerned with the components requiring cooling process, especially, an IC whose cooling side is normally controlled by the packaging side of the circuit board. When the height of e.g. the IC1 is larger than h1, it is incapable of being mounted to the lower surface of the printed circuit board 25, but can be mounted to the upper surface thereof. The height of the respective components controls the packaging side of the printed circuit board 25. When the cooling direction of a component is not oriented to the side of the heat sinks like the IC1, the countermeasure is taken by opening an aperture through the printed circuit board 25 and providing a cooling post 23 extending from the lower portion of the housing 20 so as to contact the post 23 to the IC1, but the cooling direction towards the lower portion thereof is larger in heat resistance than that towards the heat sinks 22 so as to lower cooling efficiency.

Further, in the prior packaging method of the components, the optical device modules as well as integrated circuits are packaged in the same printed circuit board. Thus, when deteriorated parts are found, it requires a lot of time and labor for repair work, and there are some cases where the circuit board as a whole shall be wasted, which causes the deterioration of productivity and the increase of production cost.

It is an object of the present invention is to solve the above issues and to provide an optical transmitter-receiver whose housing has a lower height.

Another object of the present invention is to provide an optical communication device wherein the area of the circuit board to mount the components thereof is enlarged with the realization of the structural compactness thereof.

In order to attain the objects, a printed circuit board to mount components thereto is split into several parts and the respective parts are fixed to the housing in accordance with the dimensional specifications of the optical transmitter-receiver, which parts are interconnected to one another through connectors and so forth. The height of the housing is made lower by defining the fixing location of the respective components on the split parts in accordance with the height thereof. Due attention is paid when the split parts are overlapped such that they make no contact with one another. This enlarges the area of the circuit board to mount the components thereon with the realization of the structural compactness of the optical transmitter-receiver. Further, because the packaging side of the circuit board is selected in an arbitrary manner in accordance with the cooling direction of the respective ICs, it allows such direction to be oriented to the side of the heat sinks. This enhances cooling behavior. Moreover, when deteriorated parts are found, only the split part with such parts mounted is repaired or replaced with another so as to improve productivity and reduce production cost.

These and other objects, features and advantages of the invention will be apparent from the following more particular description of the preferred embodiments of the invention, as illustrated in the accompanying drawings.

BRIEF DESCRIPTION OF THE DRAWINGS

FIG. 3 is a partly sectional side view of the prior optical transmitter-receiver.

FIG. 4 is a partly sectional side view of one example of the optical transmitter-receiver according to the invention.

DESCRIPTION OF THE PREFERRED EMBODIMENTS

Hereinafter, the preferred embodiments of the invention are described with reference to the accompanying drawings.

Figure 1:
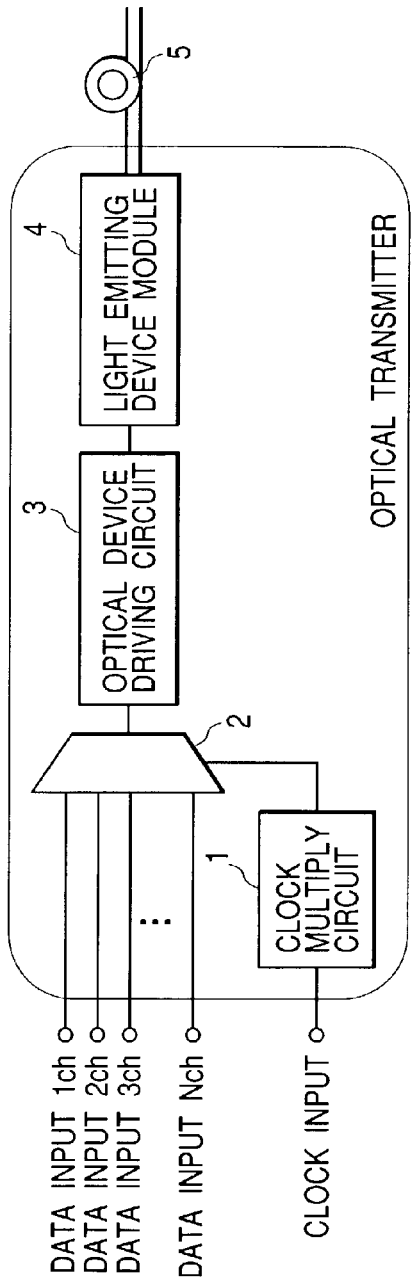
FIG. 1 is a block diagram to show one example of the optical transmitter according to the invention.
Figure 2:
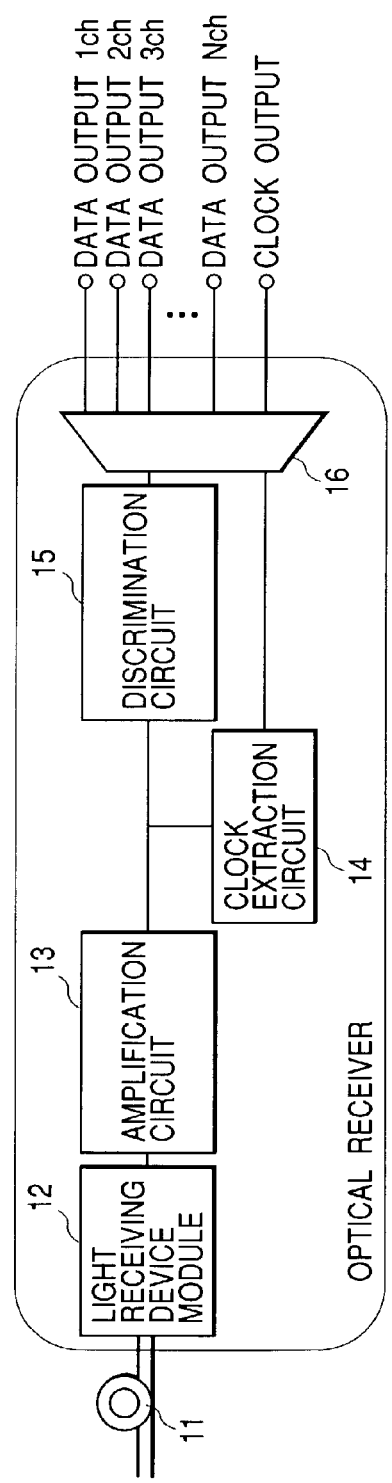
FIG. 2 is a block diagram to show one example of the optical receiver according to the invention.

FIG. 1 is a block diagram to show one example of the optical transmitter according to the invention, and FIG. 2 is a block diagram to show one example of the optical receiver according to the invention. In this embodiment, the optical transmitter and receiver are separately shown, but they may be integrated for the structural compactness thereof.

In the optical transmitter shown in FIG. 1, the electric data are input to a data multiplexing circuit 2 from the plural channels. A clock pulse is input to a clock multiply circuit 1 so as to be multiplied and output to the data multiplexing circuit 2 for multiplexing the data by the clock timing. The multiplexed data are supplied to an optical device driving circuit 3, in which circuit a driving signal is generated and input to a light emitting device module 4 and through which circuit the multiplexed data are supplied to the light emitting device module. The optical signal modulated by the multiplexed data is emitted through an optical fiber 5.

In the optical receiver shown in FIG. 2, the optical signal is input through an optical fiber 11 to a light receiving device module so as to be converted into an electric signal. After the electric signal is amplified at an amplification circuit 13, a part thereof is input to a clock extraction circuit 14 so as to generate a timing clock. The generated timing clock is supplied to a discrimination circuit 15 and an isolation circuit 16. The input data signal is divided into 0 and 1 at the discrimination circuit 15 so as to be supplied to the isolation circuit 16, from which circuit the data of the plural channels and the clock pulse are output according to the clock timing.

Hereafter, the packaging examples of the components according to the invention are described with reference to the drawings.

Figure 5:
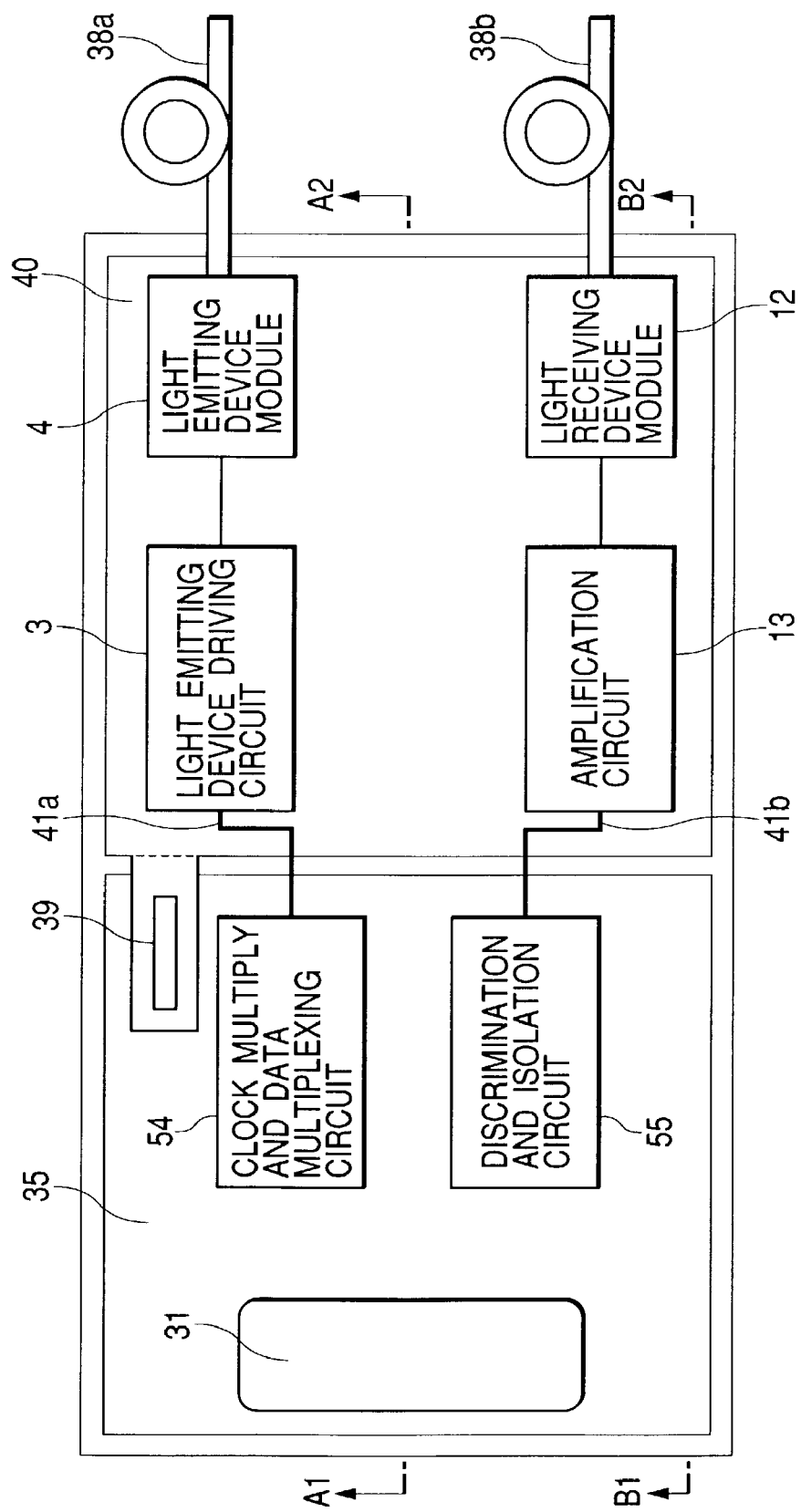
FIG. 5 is an exemplary view to show the first embodiment of the disposition of the components of the optical transmitter-receiver according to the invention.

FIG. 4 is a partly sectional side view of one example of the optical transmitter-receiver according to the invention, and FIG. 5 is an exemplary view of the first embodiment of the disposition of the components of the optical transmitter-receiver according to the invention. FIG. 4 shows the optical transmitter and receiver arranged substantially in the same manner and the cross sectional view thereof taken along the line A1-A2 or B1-B2.

In this embodiment, a printed circuit board contained in a housing 45 provided with heat sinks 32 is divided into circuit boards 35 and 40. An electric connector 31 with the height of h1 is connected between a mother board 37 and the printed circuit board 35. ICs 1 to 10 are mounted on the printed circuit board 35 while an IC11 and an optical device module 36 are mounted on the printed circuit board 40. Among the components mounted on the printed circuit boards 35 and 40, it is assumed that the highest component of all is the optical device module 36. The printed circuit boards 35 and 40 are interconnected to each other by means of an electric connector 39 and an engagement member 41. The electric connector and the engagement member are referred to as a connection means. Power and main signals are supplied from the printed circuit board 35 to the printed circuit board 40 through the electric connector 39 while high-frequency signals are supplied thereto through the engagement member such as a flexible substrate. The engagement member 41 is not required when the power and high-frequency signals are transmitted through the electric connector 39. The IC1 is mounted on the upper surface of the printed circuit board 35. The cooling body thereof is provided to the installation side of the printed circuit board 35 so that an aperture is opened through the printed circuit board 35, through which aperture a cooling post 33 is brought into contact through an elastomer heat conductor 46a with the cooling body. The IC2 is brought into contact with a cooling post 34 extending from the heat sinks 32 via a heat conductor 46c. The printed circuit board 40 is disposed between the printed circuit board 35 and the mother board 37 or disposed under the printed circuit board 35. The upper surface of the optical device module 36 mounted on the printed circuit board the inner wall of the housing 45 provided with the heat sinks 40 is brought into contact through a heat conductor 46b with the inner wall of the housing 45 provided with the heat sinks 32. Reference numeral 38 indicates an optical fiber.

In FIG. 5, the same references are used for the structural elements as shown in FIG. 4, the explanation of which is omitted. In the printed circuit board 35, there are mounted an IC comprising a data multiplexing circuit 2 and a clock multiply circuit 1 of the optical transmitter and an IC comprising a discrimination circuit 15 and an isolation circuit 16 of the optical receiver. Here, the circuit comprising the data multiplexing circuit 2 and the clock multiply circuit 1 is referred to as a clock multiply and data multiplexing circuit 54 and that comprising the discrimination circuit 15 and the isolation circuit 16 is referred to as an isolation and discrimination circuit 55. In the printed circuit board 40, there are mounted an IC comprising a light emitting device driving circuit 3 and a light emitting device module 4 of the optical transmitter and am amplification circuit 13 and a light receiving device module 12 of the optical receiver. An optical fiber is connected to the light emitting device module 4 and the light receiving device module 12, respectively, which is referred to as 38a and 38b. The printed circuit boards 35 and 40 are interconnected to each other by means of the electric connector 39 and the engagement members 41a and 41b.

In the foregoing, the engagement between the circuit boards through the connector 39 may be replaced with a socket-type connector or they may be soldered or engaged by means of a flat cable or a flexible substrate.

The optical device module 36, which comprises either a light emitting device module or a light receiving device module integrally packaging an optical device such as light emitting and receiving devices, a cooling device to keep the temperature of the optical device constant, a lens to optically unite the optical device with the optical fiber, is required to be directly fixed to the heat sinks 32 in order to enhance cooling behavior. In this embodiment, the optical device module 36 and the circuit IC11 to control the temperature and optical characteristics thereof are consolidated into the printed circuit board 40, which board is connected to the printed circuit board 35 with an electric connector 31 and ICs 1 to 10 mounted thereon through the electric connector 39, so as to lower the height of the optical transmitter-receiver controlled by the optical device module 36.

Namely, in this embodiment, the printed circuit board is split into the printed circuit boards 35 and 40, the latter of which is disposed between the former and the bottom side of the housing. Thus, assuming that the height of the connector 31, the printed circuit board 35 and the optical device module 36 respectively is defined as h1, h3 and h2, the housing 45 becomes lower than the total of h1+h2+h3.

Further, the lowering of the height of the transmitter-receiver allows a post 34 to cool the IC2 to be shortened in length so as to decrease heat resistance or enhance cooling efficiency. This makes it possible to operate the transmitter-receiver under the environment of higher temperature.

The electric connector 39 plays the role of interconnecting the printed circuit boards 35 and 40 for the transmission of main signals, control signals and the power supply as well as the grounding connection therebetween. When a high-speed transmitter-receiver is arranged, it requires that a connector having a characteristic excellent in high-speed response be adopted. When there is found no connector having a characteristic as desired, an engagement member 41 excellent in high-frequency characteristics may be adopted to interconnect the IC2 and the optical device module 36. The engagement member as mentioned above includes a flexible board, a flexible coaxial cable, a semi-rigid coaxial cable or the like. In FIG. 4, it is shown that a high-frequency signal runs through a laid-out pattern of the circuit board up to the electric connector 39 or the engagement member 41, but the connector or circuit board provided on the IC package and the optical device module may be directly connected to the engagement member 41.

In this embodiment, when deteriorated parts or defects are found in the printed circuit boards 35 or 40, only the circuit board with such deteriorated parts mounted is removed for repair or replacement, resulting in improving productivity and reducing production cost.

In the embodiment shown in FIG. 5, the light emitting device driving circuit 3 and the amplification circuit 13 are disposed on the printed circuit board 40 as a separate integrated circuit, but the improved IC packaging technology permits the function of the driving circuit 3 to be consolidated into the clock multiply and data multiplexing circuit 54 or the light emitting device module 58 and that of the amplification circuit 13 to be consolidated into the discrimination and isolation circuit 55 or the light receiving device module 12.

Figure 6:
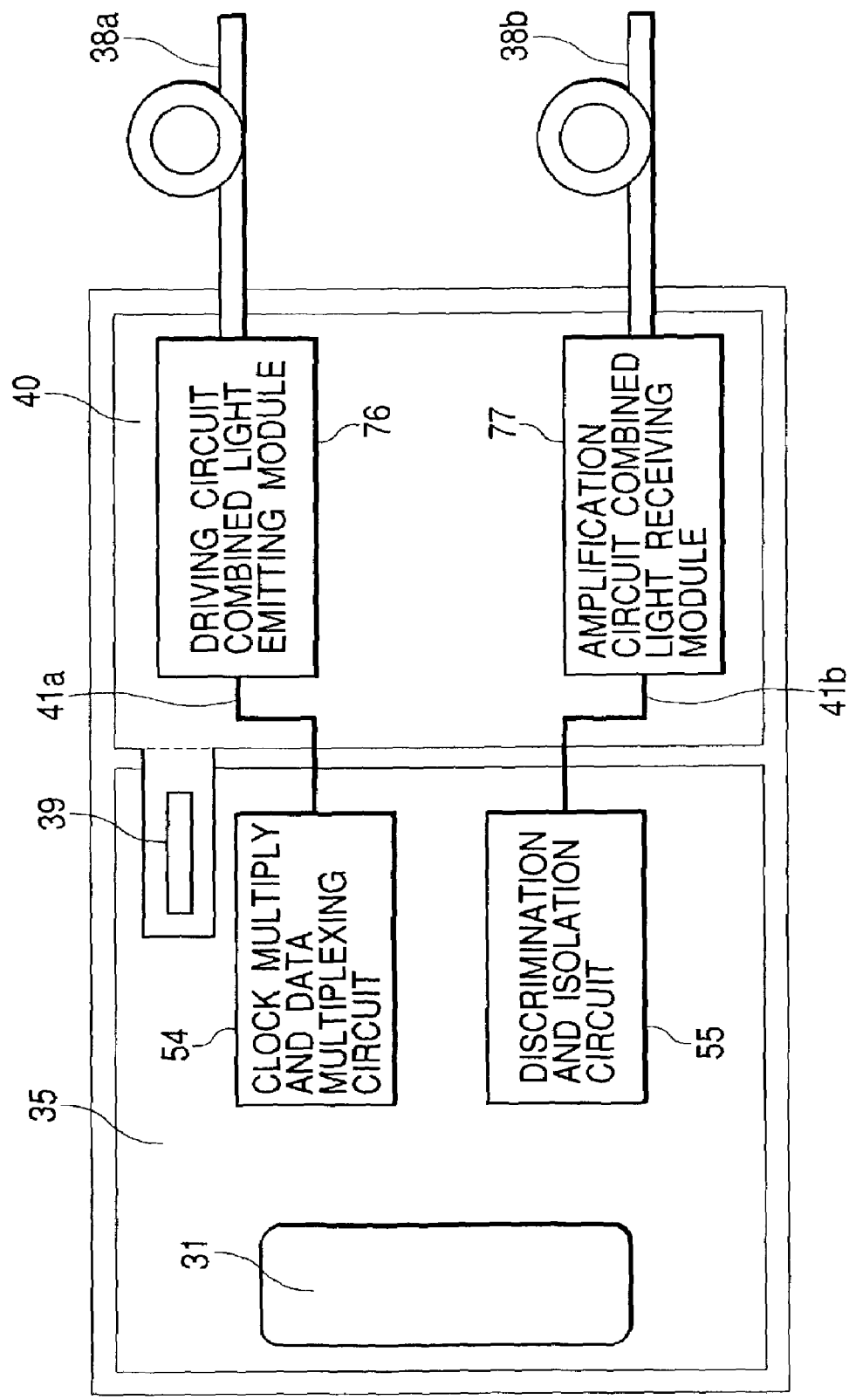
FIG. 6 is an exemplary view to show the second embodiment of the disposition of the components of the optical transmitter-receiver according to the invention.

FIG. 6 is an exemplary view of the second embodiment of the disposition of the components of the optical transmitter-receiver according to the invention. As shown in the figure, the light emitting device driving circuit 3 is consolidated into the light emitting device module 4 so as to turn into a driving circuit combined light emitting device module 48, and the amplification circuit 13 is consolidated into the light receiving device module so as to turn into an amplification circuit combined light receiving device module 12. As mentioned above, the light emitting device driving circuit 3 may be consolidated into the clock multiply and data multiplexing circuit 54, and the amplification circuit 13 may be consolidated into the discrimination and isolation circuit 55.

Figure 7:
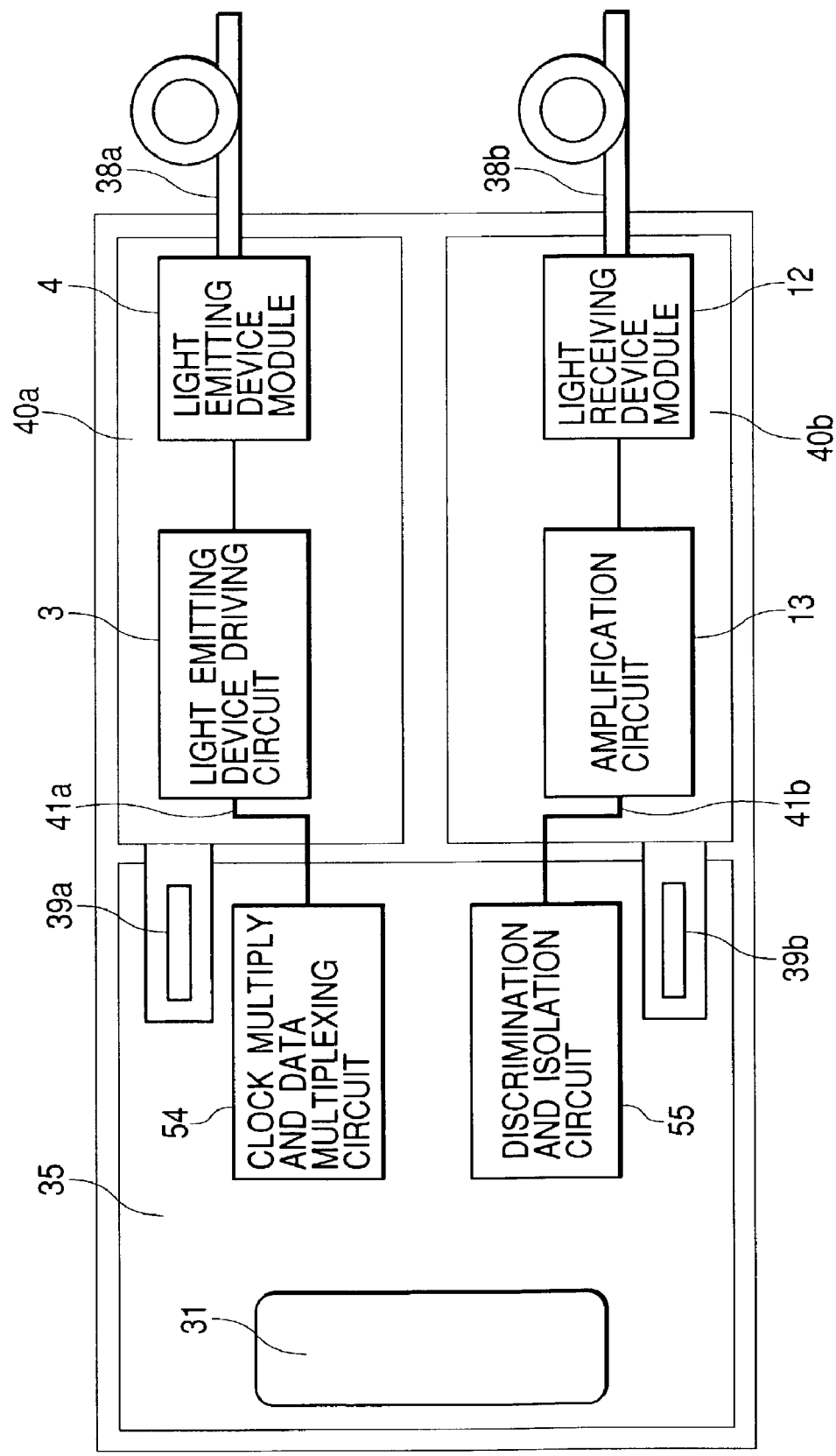
FIG. 7 is an exemplary view to show the third embodiment of the disposition of the components of the optical transmitter-receiver according to the invention.

FIG. 7 is an exemplary view of the third embodiment of the disposition of the components of the optical transmitter-receiver according to the invention. As shown in the figure, the printed circuit board is split into circuit boards 40a and 40b, in which board 40a there are mounted a light emitting device module 4 and a light emitting device driving circuit 3 and in which board 40b there are mounted a light receiving device module 12 and an amplification circuit 13. In this case, the fixing position of the respective circuit boards is set according to the size of the respective components, which gives larger latitude in the layout design of the circuit board. When deteriorated parts or defects are found, only the circuit board with such parts mounted is removed for repair or replacement, resulting in improvement of productivity.

Figure 8:
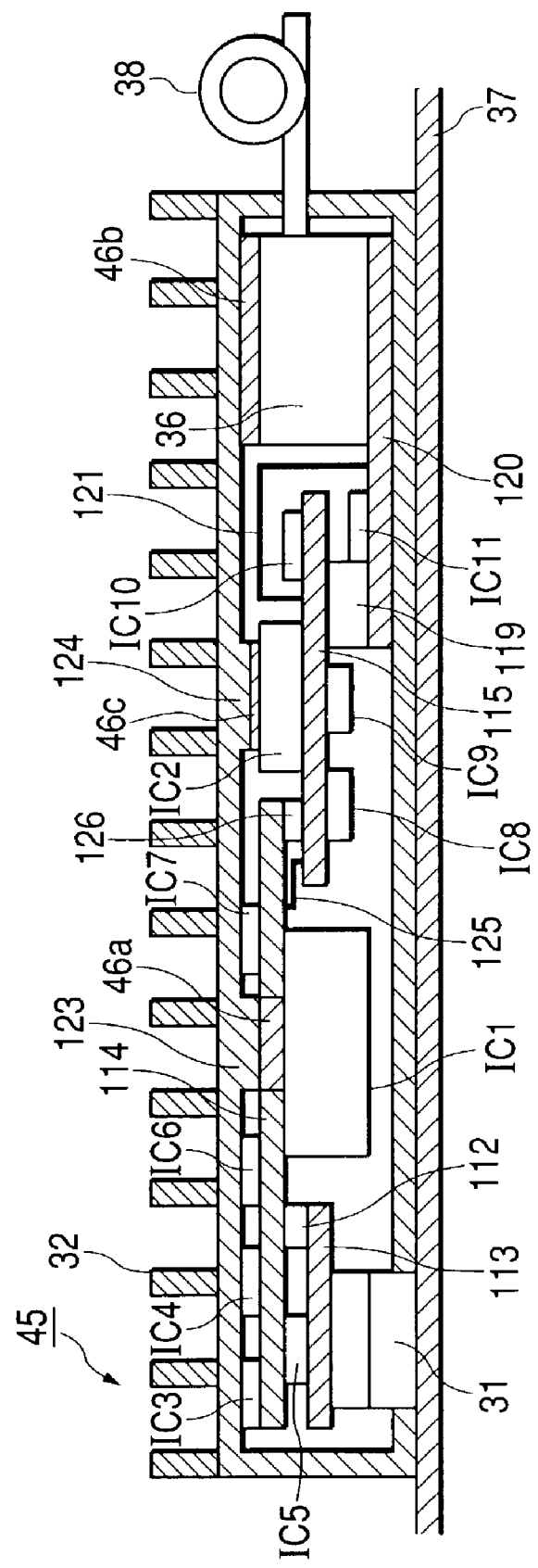
FIG. 8 is a partly sectional side view of the optical transmitter-receiver according to the fourth example of the invention.
Figure 9:
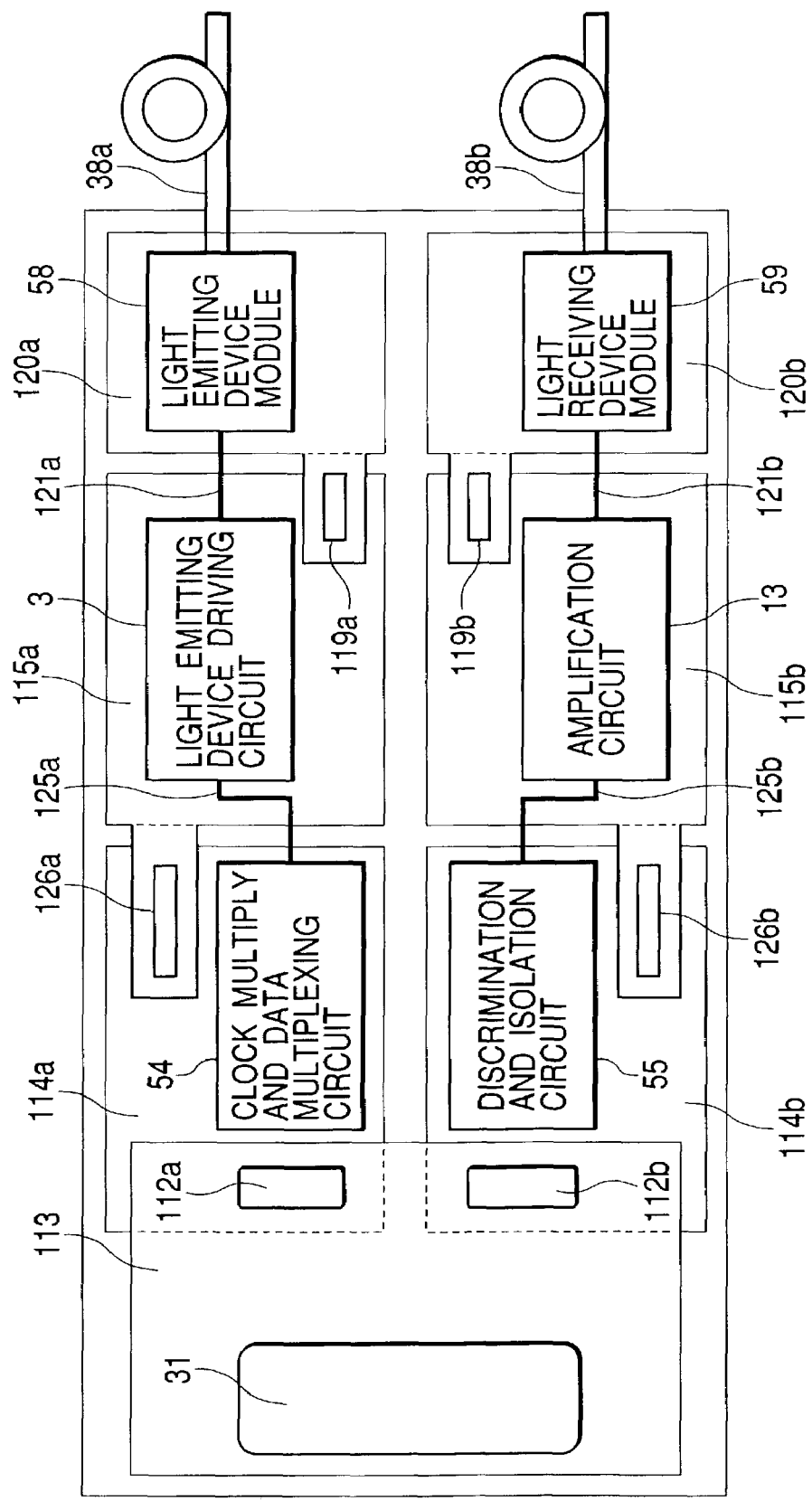
FIG. 9 is an exemplary view to show the fourth embodiment of the disposition of the components of the optical transmitter-receiver according to the invention.

FIG. 8 is a partly sectional side view of the fourth example of the optical transmitter-receiver according to the invention, and FIG. 9 is an exemplary view of the fourth embodiment of the disposition of the components of the optical transmitter-receiver according to the invention. As shown in the figure, the printed circuit board is split into seven parts.

As shown in FIG. 8, an electric connector 31 to interconnect a mother board 37 and a printed circuit board 113 is mounted in the same board. A printed circuit board 114 is provided above the printed circuit board 113 and provided with an IC1 and IC3 to IC7, and the printed circuit board 114 is connected to the printed circuit board 113 through an electric connector 112. A printed circuit board 115 is provided below the printed circuit board 113 and provided with an IC2 and IC8 to IC10, and the printed circuit board 115 is connected to the printed circuit board 114 through a connector 126. A printed circuit board 120 is disposed on the bottom side of the housing 45 and provided with an IC11 and an optical device module 36. The printed circuit board 115 is connected to the printed circuit board 120 through an electric connector 119 and an engagement member 121.

FIG. 8 shows either an optical transmitter or an optical receiver in the same way as shown in FIG. 4, and FIG. 9 is a plan view thereof. In FIG. 9, the printed circuit board 114 comprises circuit boards 114*a* and 114*b*, in which board 114*a* a clock multiply and data multiplexing circuit 54 comprising the plural ICs is mounted and in which board 114*b* a discrimination and isolation circuit 55 comprising the plural ICs is mounted. A light emitting device driving circuit 3 is mounted on the printed circuit board 115*a* and am amplification circuit 13 is mounted on the printed circuit board 115*b*. A light emitting device module is mounted on the printed circuit board 120*a* and a light receiving device module is mounted on the printed circuit board 120*b*. The printed circuit boards 114*a* and 115*a*, the printed circuit boards 114*b* and 115*b* are interconnected by means of the engagement members 125*a* and 125*b*, respectively. The printed circuit boards 115*a* and 120*a*, the printed circuit boards 115*b* and 120*b* are interconnected by means of the engagement members 121*a* and 121*b*, respectively.

In FIG. 8, the printed circuit board 113 to be connected through the electric connector 31 to the mother board 37 is provided, above which board 113 the printed circuit board 114 is disposed. Accordingly, there is a space large enough to receive the IC1 between the printed circuit board 114 and the bottom surface of the housing 45, which permits the IC1 to be mounted to the lower surface of the printed circuit board 114. Thus, a cooling post extending from the heat sink 32 is brought into contact with the cooling body of the IC1 via a heat conductor 46*a*.

Further, the printed circuit board 120 is disposed such that it contacts the bottom surface of the housing 45. Here, provided that the sum of the height h3 of the circuit board and that h2 of the component 36 is larger than the sum of the height h1 of the electric connector and that of the respective circuit boards 113 and 114 as well as that of the component mounted on the printed circuit board 114, and the IC1 is mounted between the printed circuit board 114 and the bottom surface of the housing 45 as well as the IC2 is mounted on the upper surface of the printed circuit board 115 disposed below the printed circuit board 114, the inner height of the housing 45 amounts to the sum of the height h3 of the printed circuit board 120 and that h2 of the component 36.

The height of the optical transmitter-receiver is further made lower than the arrangement shown in FIG. 4 by splitting the printed circuit board, on which the IC1 is mounted and which controls the height of transmitter-receiver, and by reversing the mounting direction of the IC1.

Further, in this embodiment, the cooling direction of the IC1 is oriented to the side of the heat sinks 32 so that cooling behavior is improved.

Moreover, the lowered height of the housing 4 allows the post 124 cooling the IC2 to be shortened so that the cooling efficiency thereof is improved.

Furthermore, the area of the circuit boards is enlarged by adjusting the fixing height thereof such that the split printed circuit boards 113, 114, 115 and 120 make no contact with one another so that the packaging area of the components is practically extended, which realizes the structural compactness of the optical transmitter-receiver.

When deteriorated parts or defects are found in the circuit board with either the optical device module 36 or the IC mounted, only the circuit board with such parts mounted is removed for repair or replacement, resulting in improving productivity and reducing production cost.

In this embodiment, the fixing position of the circuit boards with regard to the housing is set according to the size of the respective components so as to give larger latitude in the layout design thereof. When deteriorated parts or defects are found, only the circuit board with such parts mounted is removed for repair or replacement, resulting in improvement of productivity. Although all circuit boards with the respective components mounted are split into several parts, it depends on a case-by-case basis since there are cases where it is preferable that the respective components are packaged without splitting the circuit boards into parts in light of the electric and heat characteristics and size of the respective components as well as the productivity of the optical transmitter-receiver.

To note, the respective circuit boards are connected to one another through the electric connectors 112, 119 and 126, but the engagement members 125 and 121 may be adopted for the transmission of the high-frequency signal in the sama way as shown in FIG. 4. In FIG. 8, it is shown that the high-frequency signal runs through the layout pattern of the circuit board up to the electric connectors 119 and 126 or the engagement members 121 and 125, but the connector or the circuit board provided on the IC package and the optical device module may be directly connected to the engagement members 121 and 125.

As described above, according to the invention, the housing is made lower in height by splitting the respective circuit boards with the components mounted thereon into several parts and by setting the fixing position thereof with regard to the housing according to the standardized size of the respective components of the optical transmitter-receiver and by interconnecting the respective boards through the electric connectors and so forth. The split circuit boards are overlapped such that they make no contact with one another so as to enlarge the area of the circuit boards or practically increase the packaging area of the components, which realizes the structural compactness of the optical transmitter-receiver. Then, the packaging side of the respective components is selected in an arbitrary manner in accordance with the cooling direction of the respective ICs, which allows such direction to be oriented to the side of the heat sinks so as to improve cooling behavior. When deteriorated parts are found, only the circuit board with such parts mounted is removed for repair or replacement, resulting in improving productivity and reducing production cost.

According to the invention, the housing is made lower in height.

The split circuit boards are overlapped such that they make no contact with one another so as to enlarge the area thereof or practically increase the packaging area of the respective components, which realizes the structural compactness of the optical transmitter-receiver.

The packaging side of the respective components is selected in an arbitrary manner according to the cooling direction of the respective ICs, which allows such direction to be oriented to the side of the heat sinks so as to enhance cooling behavior.

When deteriorated parts are found, only the circuit board with such parts mounted is removed for repair or replacement, resulting in improving productivity and reducing production cost.

The invention may be embodied in other specific forms without departing from the spirit or essential characteristics thereof. The present embodiment is therefore to be considered in all respects as illustrative and not restrictive, the scope of the invention being indicated by the appended rather than by the foregoing description and all changes which come within the meaning and range of equivalency of the claims are therefore intended to be embraced therein.

The invention claimed is:

1. An optical communication device comprising:
a motherboard; and
a housing provided with heat sinks and mounted on the motherboard, the housing having disposed therein:
a first printed circuit board with a first electronic component mounted thereon;
a second printed circuit board with a second electronic component mounted thereon;
an electric connector which connects between said motherboard and said first printed circuit board; and
an engagement member which electrically interconnects between said first and second printed circuit boards, wherein said second printed circuit board is disposed substantially parallel with said first printed circuit board at a position between a top surface of said housing and said first printed circuit board,
wherein said second printed circuit board includes a first portion that partially overlaps with and is separated from said first printed circuit board and a second portion that does not overlap with said first printed circuit board, said second electronic component being mounted in said second portion, said second electronic component having a height greater than the separation distance between said first printed circuit board and said second printed circuit board.

2. The optical communication device according to claim 1, wherein a post extending inwardly from said housing and an elastic heat conductor are provided, wherein said post is brought into contact via said heat conductor with said first electronic component so as to cool said first electronic component.

3. An optical communication device comprising:
a motherboard; and
a housing provided with heat sinks and mounted on the motherboard, said housing having disposed therein:
a first electric connector which electrically connects between the mother board and a first circuit board;
the first circuit board which is mounted on said first electric connector;
a first electronic component;
a second electronic component having a largest height in components provided in the housing;
a first printed circuit board which is disposed through a second electric connector above said first circuit board and on a lower surface of which said first electronic component is mounted;
a second printed circuit board which is disposed in a neighborhood of a bottom surface of said housing and only on an upper surface of which said second electronic component is mounted, the second printed circuit board being disposed substantially parallel with said first printed circuit board; and
an engagement member which electrically interconnects between said first and second printed circuit boards.

4. The optical communication device according to claim 3, wherein an inner height of said housing substantially amounts to sum of a height of said second electronic component and a thickness of said second printed circuit board.

5. The optical communication device according to claim 3, wherein a cooling post extending from said heat sinks is brought into contact via a heat conductor with said first electronic component.

6. The optical communication device according to claim 3, wherein said second electronic component is brought into contact via a heat conductor with a backside surface of said housing provided with said heat sinks.

7. An optical communication device comprising:
a motherboard; and
a housing provided with heat sinks and mounted on the motherboard, the housing having disposed therein:
a first printed circuit board with a first electronic component mounted thereon;
a second printed circuit board separated from and disposed substantially parallel to said first printed circuit board, the second printed circuit board comprising a first portion opposite a surface of the first printed circuit board and a second portion extending beyond an edge of the first printed circuit board,
a second electronic component mounted on the second portion of the second printed circuit board, the second electronic component having a height greater than the separation distance between said first and second printed circuit boards;
an electric connector which connects between the motherboard and the first printed circuit board; and
an engagement member which electrically interconnects between the first and second printed circuit boards,
wherein an inner height of the housing is less than the sum of a height of a portion of said electric connector disposed within said housing, a thickness of said first printed circuit board, and the height of said second electronic component.

* * * * *